(12) United States Patent
Vinther et al.

(10) Patent No.: US 6,377,059 B2
(45) Date of Patent: *Apr. 23, 2002

(54) CROWN SHAPED CONTACT BARREL CONFIGURATION FOR SPRING PROBE

(75) Inventors: Gordon A. Vinther, Pasadena, CA (US); James A. Buccini, Sr., Oakville; Kenneth Grendziszewski, Plymouth, both of CT (US)

(73) Assignee: Delaware Capital Formation, Inc., Wilmington, DE (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/253,390

(22) Filed: Feb. 19, 1999

(51) Int. Cl.[7] ............................................... G01R 31/02
(52) U.S. Cl. ...................... 324/754; 324/761; 324/72.5
(58) Field of Search ............................... 324/754, 755, 324/761, 762, 72.5; 439/70, 71

(56) References Cited

U.S. PATENT DOCUMENTS

| | | | |
|---|---|---|---|
| 4,105,970 A | 8/1978 | Katz | 324/158 P |
| 4,168,873 A * | 9/1979 | Luna | 439/391 |
| 5,032,787 A * | 7/1991 | Johnston et al. | 324/761 |
| 5,045,780 A | 9/1991 | Swart | 324/158 P |
| 5,557,213 A * | 9/1996 | Reuter et al. | 324/754 |
| 5,576,631 A * | 11/1996 | Stowers et al. | 324/754 |
| 5,633,597 A * | 5/1997 | Stowers et al. | 324/761 |
| 5,641,315 A | 6/1997 | Swart et al. | 439/824 |
| 5,744,977 A | 4/1998 | Cuautla | 324/761 |
| 5,781,023 A * | 7/1998 | Swart et al. | 324/754 |
| 5,801,544 A | 9/1998 | Swart et al. | 324/761 |
| 5,936,421 A * | 8/1999 | Stowers et al. | 324/754 |

FOREIGN PATENT DOCUMENTS

| | | |
|---|---|---|
| JP | 48-20365 | 3/1973 |
| JP | 6-22964 | 4/1992 |

* cited by examiner

*Primary Examiner*—Michael J. Sherry
*Assistant Examiner*—Jermele M. Hollington
(74) *Attorney, Agent, or Firm*—Christie, Parker & Hale, LLP

(57) ABSTRACT

A barrel for a spring probe has a tubular body and a crown shaped terminal end for discrete point contact of the barrel. The terminal end has a drawn opening with a substantially circular cross-sectional dimension and a crown shaped contact integrally formed in the circular opening. There are several possible shapes for the crown shaped contact including pointed projections where multiple triangular shapes are placed end to end around the circumference of the terminal end, a corrugated shape with squares spaced apart around the circular edge, a wavy shape along the circular edge, or a rounded shape around the edge.

15 Claims, 2 Drawing Sheets

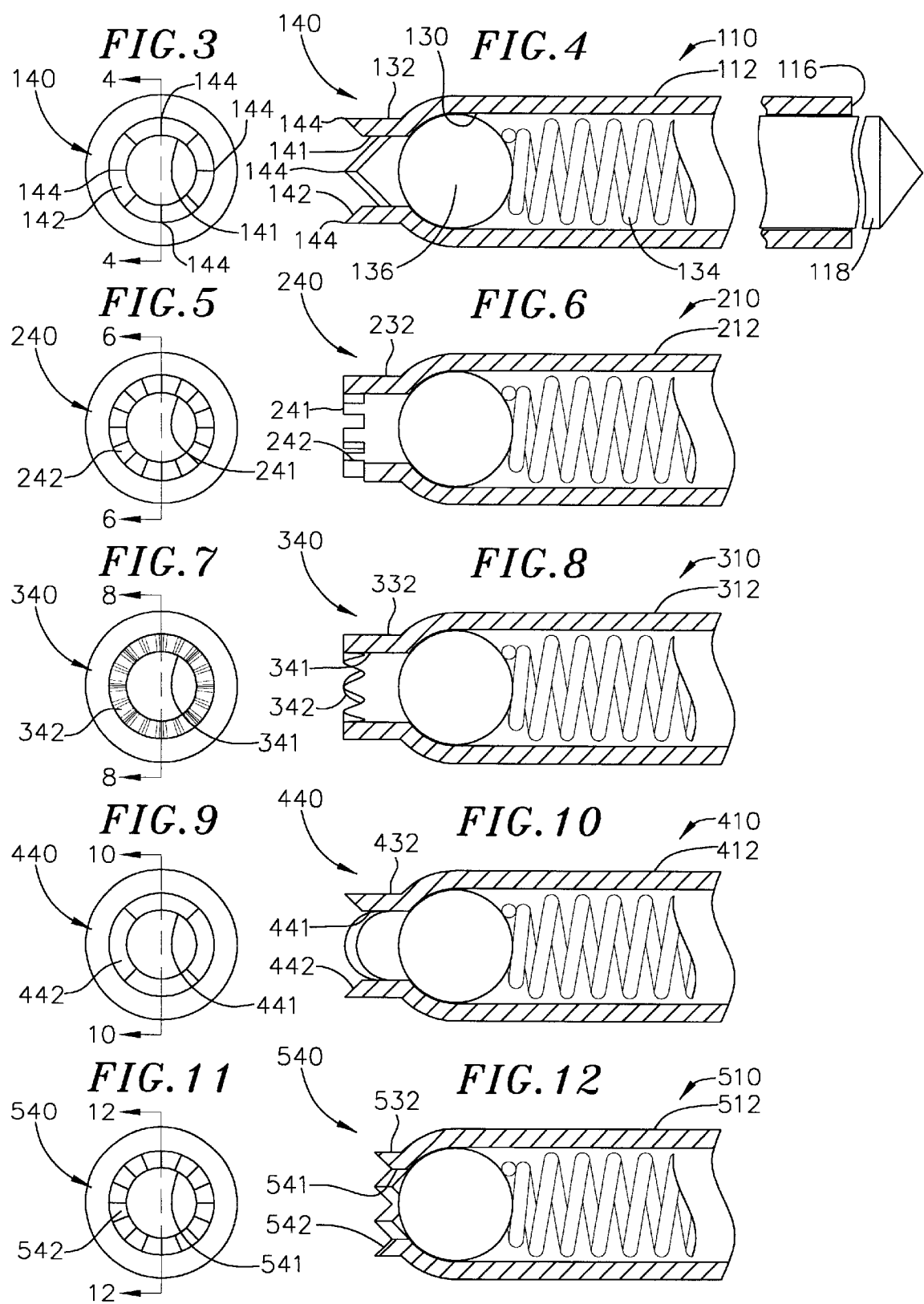

CROWN SHAPED CONTACT BARREL CONFIGURATION FOR SPRING PROBE

FIELD OF THE INVENTION

The present invention relates to electrical contact probes and, more particularly, to a barrel configuration for spring-loaded contact probes used in electrical testing applications such as providing electrical contact between diagnostic or testing equipment and an electrical device under test.

BACKGROUND OF THE INVENTION

FIGS. 1 and 2 illustrate a conventionally configured prior art spring probe that is used to perform continuity and diagnostic electrical tests on an electrical device such as a printed circuit board (PCB) and the like. The prior art spring probe 10 comprises a barrel 12 configured in the shape of a cylindrical tube having a partially-closed terminal end 14 and an open plunger end 16. A plunger 18 is partially disposed within the barrel and comprises a first radially extending bearing section 20 at one end 22 of the plunger. The plunger also includes a head or tip portion 24 at an opposite end. The head portion is configured to accommodate electrical contact with a PCB under test. The plunger 18 further comprises an elongated second bearing section 26 that extends axially from the head portion 24 toward first bearing section 20. Between the first and second bearing sections is an elongated intermediate section 28 of the plunger. The sliding contact of the first and second bearing sections 20 and 26 against an inside diameter surface 30 of the barrel guides the plunger in its axial travel within the barrel upon contact of the plunger head portion with a PCB.

The plunger 18 is partially disposed within the barrel 12 such that the first bearing section 20 and a variable length of the second bearing section 26 are adjacent the inside diameter 30 of the barrel as the plunger reciprocates in and out of the barrel during use. The barrel includes a crimped portion 32 that extends a predetermined distance toward a center portion of the barrel and acts as a stop to retain the first bearing section 20 of the plunger 18 inside the barrel.

A coil spring 34 is disposed within the barrel 12 and is positioned between the partially-closed terminal end 14 of the barrel and the end portion 22 of the plunger. A ball 36 is disposed within the barrel between the partially-closed end 14 and an adjacent end portion of the spring 34. Upon contact by the head portion 24 against a PCB portion under test, the plunger slides axially into the barrel, causing plunger end portion 22 to travel toward the partially-closed terminal end 14 of the barrel and compresses the spring. The action of the spring resisting such compression imposes a simultaneous and opposite spring force on the PCB by the plunger head portion 24, thereby providing electrical contact under the mechanically applied spring contact between the plunger and the PCB.

Methods of contacting the spring probe to a sip pin or probe pad (not shown) include surface mounting techniques. In the surface mounting connection, the partially closed terminal end of the spring probe rests on the probe pad or sip pin in a noncompressed state of the probe, and in a compressed state of the probe the terminal end is compressed against the probe pad or sip pin to make an electrical connection.

A problem associated with the surface mounting spring probe arrangement is that the pressure per unit area of the terminal end of the barrel on the contact surface is low because the relatively large surface area of contact. This low force per unit area results in poor electrical contact between the barrel and the sip pin or probe pad particularly when surface imperfections on the sip pad or probe plate are present. In the prior art designs, terminal end of the spring probe is doughnut shaped. As pressure is equal to force over area, the amount of pressure is inversely proportional to the amount of area. The doughnut shape of the terminal end of the spring probe creates a relatively large contact surface area, and results in a relatively small contact pressure per unit area with the probe pad. Consequently a need exists for a terminal end design for the barrel which increases the force per unit area.

SUMMARY OF THE INVENTION

The present invention provides a newly designed barrel configuration, and particularly a crown shaped contact barrel configuration for a spring probe which increases the force per unit area by decreasing the unit area of contact between the terminal end of the spring probe and the probe pad or sip pin.

The tubular barrel has a hollow interior, a plunger end at one end of the barrel, and a terminal end at an opposite end of the barrel. The terminal end has a drawn opening with a circular cross-sectional dimension and a crown shaped contact integrally formed in the circular opening. There are several possible shapes for the crown shaped contact including preferably pointed projections where multiple triangular shapes are placed end to end around the circumference of the terminal end, and less preferably a corrugated shape with squares spaced apart around the circular edge, a wavy shape along the circular edge, or a rounded shape around the edge.

BRIEF DESCRIPTION OF THE DRAWINGS

These and other features and advantages of the present invention will become appreciated as the same becomes better understood with reference to the specification, claims and drawings wherein:

FIG. 3 is an end view of a crown shaped contact barrel configuration for a spring probe with pointed projections according to a preferred embodiment of this invention;

FIG. 4 is a cross-sectional partial side view of the crown shaped contact barrel configuration for the spring probe of FIG. 3 taken along line 3—3;

FIG. 5 is an end view of a crown shaped contact barrel configuration for a spring probe with corrugated projections according to a first alternative embodiment of this invention;

FIG. 6 is a cross-sectional partial side view of the crown shaped contact barrel configuration for the spring probe of FIG. 5 taken along line 6—6;

FIG. 7 is an end view of a crown shaped contact barrel configuration for a spring probe with wavy projections according to a second alternative embodiment of this invention;

FIG. 8 is a cross-sectional partial side view of the crown shaped contact barrel configuration for the spring probe of FIG. 7 taken along line 8—8;

FIG. 9 is an end view of a crown shaped contact barrel configuration for a spring probe with round projections according to a third alternative embodiment of this invention;

FIG. 10 is a cross-sectional partial side view of the crown shaped contact barrel configuration for the spring probe of FIG. 9 taken along line 10—10;

FIG. 11 is an end view of a crown shaped contact barrel configuration for a spring probe with multiple projections according to a fourth alternative embodiment of this invention; and FIG. 12 is a cross-sectional partial side view of the crown shaped contact barrel configuration for the spring probe of FIG. 11 taken along line 12—12.

DETAILED DESCRIPTION OF THE INVENTION

Figure 1:
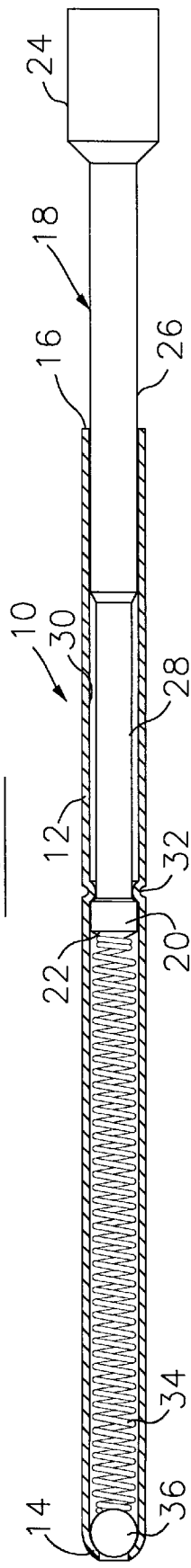
FIG. 1 is a cross-sectional side view of a prior art high-force spring probe.
Figure 2:
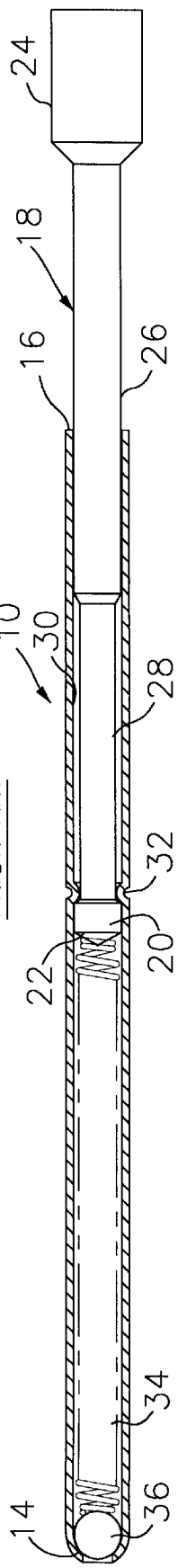
FIG. 2 is a cross-sectional side view of the prior art high-force spring probe of FIG. 1 shown with a spring partly in phantom lines.

As in the prior art shown in FIGS. 1, and 2, the spring probe 110 of a first embodiment of the present invention shown in FIGS. 3, 4 is used to perform continuity and diagnostic electrical tests on an electrical device such as a printed circuit boards (PCB) and the like. The spring probe 110 comprises a barrel 112 configured in the shape of a cylindrical tube having a terminal end 140 and an open plunger end 116. A plunger 118 is partially disposed within the barrel and includes a bearing section at one end of the plunger and a head or tip portion at an opposite end. The head portion is configured to accommodate electrical contact with a PCB under test.

The barrel includes a crimped portion (not shown) that extends a predetermined distance toward a center portion of the barrel and acts as a stop to retain the bearing section of the plunger 118 positioned inside the barrel.

A coil spring 134 is disposed within the barrel 112 and is positioned between the terminal end 140 of the barrel and the end of the plunger. A ball 136 can be disposed within the barrel between the terminal end 140 and an adjacent end portion of the spring 134.

An inside diameter surface 130 of the barrel 112 at the terminal end 140 has a spherical radius adapted to hold the ball 136 in place. The terminal end has a drawn portion 132 which defines a circular opening 141 at the end of the drawn portion having a diameter smaller than inside diameter 130. Contact teeth 142 are cut into the drawn portion 132 around the circular opening 141 to provide discrete point contact 144 for the barrel.

In this embodiment terminal end 140 includes four pointed contact teeth for contact with the probe pad or sip pin (not shown). The contact teeth are preferably triangular shapes which are placed around the circumference of the circular opening 141 as shown in FIG. 3.

There can be as few as two contact teeth generating point contact between the barrel and the sip pin, or a multiplicity of point contacts as shown in FIGS. 11 and 12. However, if too many point contacts are formed on the barrel, the increased area will decrease the contact pressure. Preferably, four sharp points are desired for a stable contacting area, and economy of manufacturing.

Other geometrical configurations for the terminal end of the barrel are also contemplated by the present invention. FIG. 5 is an end view of a first alternative crown shaped contact barrel configuration for a spring probe 210 with a plurality of corrugated contact teeth 242 in the terminal end 240 of the barrel 212. As shown in FIGS. 5 and 6 the contact teeth 142 are corrugated, in that a plurality of square shapes spaced apart from each other are cut into the drawn portion 232 along the circular opening 241 in the terminal end 240.

FIG. 7 is an end view of a second alternative crown shaped contact barrel configuration for a spring probe 310 with a plurality of wavy contact teeth 342 in the terminal end 340 of the barrel 312. As shown in FIGS. 7 and 8, the contact teeth 342 are a wavy shape spaced apart from each other and are cut into the drawn portion 332 along the circular opening 341 in the terminal end 340.

FIG. 9 is an end view of a third alternative crown shaped contact barrel configuration for a spring probe 410 with a plurality of grounded contact teeth 442 in the terminal end 440 of the barrel 412. As shown in FIGS. 9 and 10, the contact teeth 442 are rounded in shape and are spaced apart from each other and are cut into the drawn portion 432 along the circular opening 441 in the terminal end 440.

FIG. 11 is an end view of a fourth alternative crown shaped contact barrel configuration for a spring probe 510 with a plurality of smaller triangular contact teeth 542 in the terminal end 540 of the barrel 512. As shown in FIGS. 11 and 12, the contact teeth 542 are spaced apart from each other and are cut into the drawn portion 532 along the circular opening 541 in the terminal end 540. As with all the geometrical configurations in the terminal end of the barrel, the objective is to increase the contact force per unit area by decreasing the area of contact between the barrel and the probe pad or sip pin.

Although the present invention has been described and is illustrated with respect to various embodiments thereof, it is to be understood that it is not to be so limited, because changes and modifications may be made therein which are within the full intended scope of this invention as hereinafter claimed.

What is claimed is:

1. A barrel of a spring probe comprising a tubular body having a crown shaped terminal end extending from the tubular body, the terminal end having an opening with a substantially circular edge having a plurality of contact teeth formed in the circular edge for discrete point contact of the terminal end.

2. The barrel of claim 1 wherein the contact teeth are triangular.

3. The barrel of claim 1 wherein the contact teeth are corrugated.

4. The barrel of claim 1 wherein the contact teeth are round.

5. The barrel of claim 1 wherein the contact teeth are wavy.

6. A barrel of a spring probe comprising:
   a tubular body portion;
   a plunger opening located at one end of the body portion; and
   a terminal end located at one end of the body portion opposite the plunger opening, the terminal end having at least two triangular contact teeth.

7. A barrel of a spring probe comprising:
   a tubular body portion;
   a plunger opening located at one end of the body portion; and
   a terminal end located at one end of the body portion opposite the plunger opening, the terminal end having at least two corrugated contact teeth.

8. A barrel of a spring probe comprising:
   a tubular body portion;
   a plunger opening located at one end of the body portion; and
   a terminal end located at one end of the body portion opposite the plunger opening, the terminal end having at least two round contact teeth.

9. A barrel of a spring probe comprising:

a tubular body portion;

a plunger opening located at one end of the body portion; and a terminal end located at one end of the body portion opposite the plunger opening, the terminal end having at least two wavy contact teeth.

10. A spring probe comprising:

a tubular barrel having:

a hollow interior, a plunger end at one end of the barrel, and a terminal end at an opposite end of the barrel, the terminal end having an opening with a substantially circular edge and a crown shaped contact having a plurality of contact projections integrally formed in the circular edge of the opening;

a plunger disposed within the barrel interior; and a plunger control spring disposed within the barrel between the plunger and the terminal end of the barrel.

11. The spring probe of claim 10 wherein the plurality of projections are corrugated.

12. The spring probe of claim 10 wherein the plurality of projections are wavy.

13. The spring probe of claim 10 wherein the plurality of projections are round.

14. The spring probe of claim 10 wherein the plurality of projections are triangular.

15. The spring probe of claim 14 wherein there are four triangular projections spaced around a circumference of the circular edge.

* * * * *